US009153754B2

(12) United States Patent
He et al.

(10) Patent No.: US 9,153,754 B2
(45) Date of Patent: Oct. 6, 2015

(54) LIGHT EMITTING DIODE (LED) RED FLUORESCENT MATERIAL AND LIGHTING DEVICE HAVING THE SAME

(75) Inventors: Huaqiang He, Beijing (CN); Yuanhong Liu, Beijing (CN); Ronghui Liu, Beijing (CN); Yunsheng Hu, Beijing (CN); Tao He, Beijing (CN)

(73) Assignee: Grirem Advanced Materials Co., Ltd., Beijing (CN)

( * ) Notice: Subject to any disclaimer, the term of this patent is extended or adjusted under 35 U.S.C. 154(b) by 0 days.

(21) Appl. No.: 14/352,578

(22) PCT Filed: Jun. 29, 2012

(86) PCT No.: PCT/CN2012/077899
§ 371 (c)(1),
(2), (4) Date: Apr. 17, 2014

(87) PCT Pub. No.: WO2013/056570
PCT Pub. Date: Apr. 25, 2013

(65) Prior Publication Data
US 2014/0246693 A1     Sep. 4, 2014

(30) Foreign Application Priority Data
Oct. 17, 2011  (CN) .......................... 2011 1 0314400

(51) Int. Cl.
*B32B 5/16*     (2006.01)
*C09K 11/08*    (2006.01)
(Continued)

(52) U.S. Cl.
CPC .......... *H01L 33/502* (2013.01); *C09K 11/0883* (2013.01); *C09K 11/7734* (2013.01); *C09K 11/88* (2013.01); *H05B 33/14* (2013.01)

(58) Field of Classification Search
CPC ........... C09K 11/0883; C09K 11/7734; C09K 11/7731; H01L 27/15; H01L 33/502
USPC ............. 313/503, 483; 252/301.4 F, 301.6 R; 257/98
See application file for complete search history.

(56) References Cited

U.S. PATENT DOCUMENTS

2008/0303410 A1\* 12/2008 Kaneda et al. ................. 313/503
2010/0045163 A1\*  2/2010 Winkler et al. ............... 313/486
(Continued)

FOREIGN PATENT DOCUMENTS

CN      1453330 A     11/2003
CN      1461791 A     12/2003
(Continued)

OTHER PUBLICATIONS

Zhao, Chunlei et al; Study on Y2O5: Eu, Mg, Ti, Tb Red Long Persistence Phosphor, Journal of the Chinese Rare Earth Society, Dec. 2002, vol. 20, No. 6, pp. 593-596, particularly the section of experiments, CODEN: ZXXUE5. ISSN: 1000-4343.
(Continued)

*Primary Examiner* — Kimberly Rizkallah
*Assistant Examiner* — Brian Turner
(74) *Attorney, Agent, or Firm* — Fraser Clemens Martin & Miller LLC; James D. Miller

(57) ABSTRACT

Provided are a Light Emitting Diode (LED) red fluorescent material and a lighting device having the same. The florescent material consists of elements M, A, D, X, L and Z, wherein element M at least contains one or more than one element of Be, Mg, Ca, Sr, Ba and Zn; element A at least contains one or more than one element of B, Al, Ga, In, La, Gd, Lu, Sc and Y; element D at least contains one or more than one element of Si, Ge, C, Sn, Ti, Zr and Hf; element X at least contains one or more than one element of N, O and F; element L at least contains one or more than one element of S, Se and Te; and element Z at least contains one or more than one element of a rare earth element or a transition-metal element.

17 Claims, 1 Drawing Sheet

(51) Int. Cl.
*H01J 1/62* (2006.01)
*H01L 33/50* (2010.01)
*C09K 11/77* (2006.01)
*C09K 11/88* (2006.01)
*H05B 33/14* (2006.01)

(56) References Cited

U.S. PATENT DOCUMENTS

| | | | |
|---|---|---|---|
| 2011/0147783 A1* | 6/2011 | Chang | 257/98 |
| 2011/0248303 A1* | 10/2011 | Suzuki et al. | 257/98 |
| 2012/0062106 A1* | 3/2012 | Okada et al. | 313/503 |
| 2013/0168605 A1* | 7/2013 | Li et al. | 252/301.4 F |

FOREIGN PATENT DOCUMENTS

| | | |
|---|---|---|
| CN | 1977030 A | 6/2007 |
| CN | 101475804 A | 7/2009 |
| EP | 2135916 A2 | 12/2009 |

OTHER PUBLICATIONS

Li, Xubo et al; Research on Spectral Properties of Red Long Afterglow Phosphor Y2O2S: Eu, Mg, Ti. Journal of Guangdong Non-Ferrous Metals, Mar. 2006, vol. 16, No. 1, pp. 12-15, and particularly figure 2, CODEN: GYJXFF. ISSN: 1003-7837.

* cited by examiner

LIGHT EMITTING DIODE (LED) RED FLUORESCENT MATERIAL AND LIGHTING DEVICE HAVING THE SAME

CROSS-REFERENCE TO RELATED APPLICATION

This application is a U.S. National Phase application from International PCT Application No. PCT/CN2012/077899 filed on Jun. 29, 2012 which claimed benefit of Chinese Patent Application No. 201110314400.6 filed Oct. 17, 2011. The entire disclosure of the above applications are incorporated herein by reference.

TECHNICAL FIELD

The present disclosure relates to a Light Emitting Diode (LED) red fluorescent material and a lighting device having the same, particularly to a red nitride fluorescent material and a lighting device having the same, belonging to the filed of semiconductor technology.

BACKGROUND OF THE INVENTION

White light LEDs, which have advantages of low voltage, high light efficiency, low energy consumption, long life and no pollution etc., have been used in fields including semiconductor illumination and liquid crystal flat panel display successfully. Currently, there are two major implementation methods of white light LEDs: one is the combination of LED chips of the three primary colors (red, blue and green) and the other one is a single blue light/ultraviolet chip compound fluorescent material. Between these two methods, the second implementation method, which is simple, easy and relatively cheap, becomes the mainstream solution of white light LEDs. A red fluorescent material, which is an important part in the three primary colors red, green and blue, is indispensable in the white light implementation process. In addition to compensating the lack of red in "blue light LED+YAG:Ce", the red fluorescent material can be further matched with a blue light LED and a green fluorescent material to generate white light, or matched with green and blue fluorescent materials and a purple light or ultraviolet LED to generate white light.

LED red fluorescent materials which have been reported at present include $Eu^{2+}/Eu^{3+}$ or $Mn^{4+}$-activated fluorescent materials, typically $(Ca,Sr)S:Eu^{2+}$, $Y_2O_3:Eu^{3+}$, $Bi^{3+}$, $Y_2O_2S:Eu^{3+}$, $Bi^{3+}$, $Y(V,P)O_4:Eu^{3+}$ and $CaMoO_4:Eu^{3+}$ etc. Among them, $(Ca,Sr)S:Eu^{2+}$ has relatively good spectral matching performance with blue light LEDs. However, applications of $(Ca,Sr)S:Eu^{2+}$ on LEDs are greatly limited due to problems of bad stability and high luminous decay etc. $Eu^{3+}$ is used as an activator to fluorescent materials including $Y_2O_3:Eu$, Bi, $Y_2O_2S:Eu$, Bi, $Y(V,P)O_4:Eu$ and $CaMoO_4:Eu$. The excitation spectra of these fluorescent materials are some sharp line spectra in long wave ultraviolet of above 370 nm and visible light regions, thereby increasing the difficulty of precise screening and effective control of matched chips. In addition, the excitation efficiency of these several fluorescent materials is extremely low in long wave ultraviolet or visible blue light regions. Although the lighting efficiency of $CaMoO_4:Eu^{3+}$ newly developed in recent years has been improved because of the doping of high concentration of $Eu^{3+}$, the application of $CaMoO_4:Eu^{3+}$ is also limited greatly by its stringent requirements on chips.

A category of novel nitrogen/nitrogen oxide fluorescent materials have been developed since the late 1990s. Anionic groups of these fluorescent materials contain $N^{3-}$ with high negative charge, and the excitation spectra of the fluorescent materials move towards long wave directions including near ultraviolet and visible lights etc. due to the expansion effect of electronic cloud. In addition, the substrates of the fluorescent materials have compact network structures as well as stable physical and chemical properties, thus leading to enthusiasm for researches on fluorescent materials with nitrogen/nitrogen oxides as substrates.

A category of nitride red fluorescent materials, $M_xSi_yN_z$:Eu (M is at least one of Ca/Sr/Ba and z=2/3x+4/3y), were disclosed in a patent document EPI 104799A1 in 2001, and there are mainly three typical fluorescent materials $MSiN_2$:Eu, $M_2Si_5N_8$:Eu and $MSi_7N_{10}$:Eu. This series of red fluorescent materials have relatively bad thermal stability. After the fluorescent materials are heated, their brightness will decrease rapidly.

A category of red fluorescent materials, $M_aA_bD_cE_dX_e$, were disclosed in a patent document WO2005/052087 in 2005. In the formula, M is one or two elements of Mn, Ce, Pr, Nd, Sm, Eu, Tb, Dy, Ho, Er, Tm and Yb, A is one or two elements of Mg, Ca, Sr and Ba, D is one or two elements of tetravalent metal elements Si, Ge, Sn, Ti, Zr and Hf, E is one or two elements of B, Al, Ga, In, Sc, Y, La, Gd and Lu, X is selected from one or two elements of O, N and F. In addition, the red fluorescent materials have a $CaAlSiN_3$ structure and a typical fluorescent material is $CaAlSiN_3$:Eu. The thermal stability of this category of fluorescent materials is obviously higher than that of $M_xSi_yN_z$:Eu-series (M is at least one of Ca/Sr/Ba and z=2/3x+4/3y) red nitride fluorescent materials, thus arousing widespread attention in the field.

A red fluorescent material having a compositional formula of $M_mA_aB_bN_n:Z_z$ was disclosed in a patent document CN100340631C in 2005, wherein M is one or more than one element of Be, Mg, Ca, Sr, Ba and Zn, A is one or more than one element of B, Al, Ga, In, Tl, Y and Sc, B is one or more than one element of Si, Ge, Sn and Pb, N is nitrogen, Z is an activator selected from at least one of a rare earth element or a transition element, and (m+z):a:b:n=1:1:1:3. At the same time, the carbon content is limited below 0.08 wt % and the oxygen content is less than 3 wt % in the fluorescent material in the patent.

A red fluorescent material was disclosed in a patent document CN101090953A in 2006. The crystal phase of the fluorescent material is Eu-activated $CaAlSiN_3$. The primary particle size of the fluorescent material is smaller than or equal to 10 μm, and the fluorescent product is not allowed to contain AlN in the patent. The patent simultaneously discloses a raw material and a synthesis method of the fluorescent material. At the same time, the doping concentration of the activator $Eu^{2+}$ is limited to be 0.01% to 10%.

A $(Ca,Sr)AlSiN_3:Eu^{2+}$ red fluorescent material was also disclosed in a patent document WO2010/074963A1 in 2010. In addition, the contents of impurity oxygen and halogen in the fluorescent material are limited and it is required that the content of impurity oxygen is lower than 2 wt % and the content of halogen (F or/and Cl) is higher than 0 and lower than 2 atomic percent.

SUMMARY OF THE INVENTION

One purpose of the present disclosure is to provide an LED red fluorescent material with excellent thermal stability, whose lighting efficiency is higher than that of the present conventional $Eu^{2+}$-activated red fluorescent materials having $CaAlSiN_3$ structures.

The other purpose of the present disclosure is to provide a lighting device using the red fluorescent material and having excellent color rendering performance.

The present disclosure launched a series of careful researches on nitride-series red fluorescent materials constituted by elements M, A, D, X, L and Z, especially red nitride fluorescent materials containing nitrogen, trace oxygen, Se and carbon, in which element M represented by Ca, element A represented by Al, element D represented by Si and taking $CaAlSiN_3$ as the main phase. The researches show that the doping of Se is able to not only increase the lighting intensity, but also regulate the photochromic properties of fluorescent materials and that a small amount of oxygen in the fluorescent materials can widen the emission peaks of the fluorescent materials. At the same time, the trace carbon can inhibit the oxidation of the lighting center $Eu^{2+}$. The cations M with positive valence in the substrates are substituted to regulate the crystal field strength of the substrates. For example, the main emission peak of the fluorescent material of the present disclosure has a gradual redshift and the luminescent color turns redder with the increase of the Sr content and the decrease of the Ca content in the fluorescent material.

Therefore, in order to realize the purposes above, the present disclosure applies the following technical solution:

an LED red fluorescent material, the red fluorescent material consists of elements M, A, D, X, L and Z, wherein element M at least contains one or more than one element of Be, Mg, Ca, Sr, Ba and Zn; element A at least contains one or more than one element of B, Al, Ga, In, La, Gd, Lu, Sc and Y; element D at least contains one or more than one element of Si, Ge, C, Sn, Ti, Zr and Hf; element X at least contains one or more than one element of N, O and F; element L at least contains one or more than one element of S, Se and Te; and element Z at least contains one or more than one element of a rare-earth element or a transition-metal element.

A preferred general formula of the LED red fluorescent material of the present disclosure is $M_m A_a D_b X_d L_y : Z_n$, where $0.5 \leq m \leq 1.5$, $0.5 \leq a \leq 1.5$, $0.5 \leq b \leq 1.5$, $2 \leq d \leq 5$, $0.00001 \leq y \leq 0.02$ and $0.0001 \leq n \leq 0.1$.

In the LED red fluorescent material of the present disclosure, element M at least contains one or more than one element of Ca, Sr and Ba; element A at least contains one or more than one element of Al, B, Gd and Y; element D at least contains one or two elements of Si and C; element X at least contains one or two elements of N and O; element L at least contains Se; element Z at least contains one or more than one element of Eu, Ce and Mn.

The LED red fluorescent material of the present disclosure, wherein element M preferably contains Ca and Sr, and the atom number ratio Ca/(Sr+Ca) is w, where $0.03 \leq w \leq 0.2$.

The LED red fluorescent material of the present disclosure, wherein element D contains C and the weight percentage of element C in the fluorescent material is from 0.001% to 0.4%.

The LED red fluorescent material of the present disclosure, wherein element X contains O and the weight percentage of element O in the fluorescent material is from 0.01% to 5%.

The LED red fluorescent material of the present disclosure, element D preferably contains C. At the same time, element X contains O. In addition, the weight percentage of element C in the fluorescent material is from 0.001% to 0.4%, and the weight percentage of element O in the fluorescent material is from 0.01% to 5%.

The red fluorescent material of the present disclosure is in a powder shape, a film shape or a sheet shape.

A fluorescent film or a fluorescent sheet is formed by the red nitride fluorescent material dispersed in a glass material, a plastic material or a resin material, or is formed by dispersing the red nitride fluorescent material and other fluorescent materials in the glass material, the plastic material or the resin material or coating the red nitride fluorescent material and other fluorescent materials on the glass material, the plastic material or the resin material.

Other fluorescent materials in the fluorescent film or the fluorescent sheet are one or more than one of the following fluorescent materials: $(Y,Gd,Lu,Tb)_3(Al,Ga)_5O_{12}$:Ce, $(Mg,Ca,Sr,Ba)_2SiO_4$:Eu, $(Ca,Sr)_3SiO_5$:Eu, $(La,Ca)_3Si_6N_{11}$:Ce, α-SiAlON:Eu, β-SiAlON:Eu, $Ba_3Si_6O_{12}N_2$:Eu, $Ca_3(Sc,Mg)_2Si_3O_{12}$:Ce, $CaSc_2O_4$:Eu, $BaAl_8O_{13}$:Eu, $(Ca,Sr,Ba)Al_2O_4$:Eu, $(Sr,Ca,Ba)(Al,Ga,In)_2S_4$:Eu, $(Ca,Sr)_8(Mg,Zn)(SiO_4)_4Cl_2$:Eu/Mn, $(Ca,Sr,Ba)_3MgSi_2O_8$:Eu/Mn, $(Ca,Sr,Ba)_2(Mg,Zn)Si_2O_7$:Eu, $Zn_2SiO_4$:Mn, $(Y,Gd)BO_3$:Tb, ZnS:Cu, Cl/Al, ZnS:Ag, Cl/Al, $(Sr,Ca)_2Si_5N_8$:Eu, $(Li,Na,K)_3ZrF_7$:Mn, $(Li,Na,K)_2(Ti,Zr)F_6$:Mn, $(Ca,Sr,Ba)(Ti,Zr)F_6$:Mn, $Ba_{0.65}Zr_{0.35}F_{2.7}$:Mn, $(Sr,Ca)S$:Eu, $(Y,Gd)BO_3$:Eu, $(Y,Gd)(V,P)O_4$:Eu, $Y_2O_3$:Eu, $(Sr,Ca,Ba,Mg)_5(PO_4)_3Cl$:Eu, $(Ca,Sr,Ba)MgAl_{10}O_7$:Eu, $(Ca,Sr,Ba)Si_2O_2N_2$:Eu, $3.5MgO \cdot 0.5MgF_2 \cdot GeO_2$:Mn.

A lighting device, the lighting device at least contains a radiation source and the red fluorescent material.

In the lighting device, the radiation source is a vacuum ultraviolet radiation source, or an ultraviolet radiation source, or a purple light radiation source, or a blue light emission source.

The lighting device contains one or more than one of other fluorescent materials excited by the radiation source to emit light. The other fluorescent materials is one or more of the following fluorescent materials: $(Y,Gd,Lu,Tb)_3(Al,Ga)_5O_{12}$:Ce, $(Mg,Ca,Sr,Ba)_2SiO_4$:Eu, $(Ca,Sr)_3SiO_5$:Eu, $(La,Ca)_3Si_6N_{11}$:Ce, α-SiAlON:Eu, β-SiAlON:Eu, $Ba_3Si_6O_{12}N_2$:Eu, $Ca_3(Sc,Mg)_2Si_3O_{12}$:Ce, $CaSc_2O_4$:Eu, $BaAl_8O_{13}$:Eu, $(Ca,Sr,Ba)Al_2O_4$:Eu, $(Sr,Ca,Ba)(Al,Ga,In)_2S_4$:Eu, $(Ca,Sr)_8(Mg,Zn)(SiO_4)_4Cl_2$:Eu/Mn, $(Ca,Sr,Ba)_3MgSi_2O_8$:Eu/Mn, $(Ca,Sr,Ba)_2(Mg,Zn)Si_2O_7$:Eu, $Zn_2SiO_4$:Mn, $(Y,Gd)BO_3$:Tb, ZnS:Cu, Cl/Al, ZnS:Ag, Cl/Al, $(Sr,Ca)_2Si_5N_8$:Eu, $(Li,Na,K)_3ZrF_7$:Mn, $(Li,Na,K)_2(Ti,Zr)F_6$:Mn, $(Ca,Sr,Ba)(Ti,Zr)F_6$:Mn, $Ba_{0.65}Zr_{0.35}F_{2.7}$:Mn, $(Sr,Ca)S$:Eu, $(Y,Gd)BO_3$:Eu, $(Y,Gd)(V,P)O_4$:Eu, $Y_2O_3$:Eu, $(Sr,Ca,Ba,Mg)_5(PO_4)_3Cl$:Eu, $(Ca,Sr,Ba)MgAl_{10}O_{17}$:Eu, $(Ca,Sr,Ba)Si_2O_2N_2$:Eu, $3.5MgO \cdot 0.5MgF_2 \cdot GeO_2$:Mn.

It is not difficult to see from the above technical solution, different from $M_xSi_yN_z$:Eu and $CaAlSiN_3$:Eu reported in documents, element L in the $M_m A_a D_b X_d L_y$:Zn fluorescent material involved in the present disclosure includes an oxygen family non-gaseous element. Especially, the addition of element Se plays an important role in the crystallization and lighting performance of the fluorescent material. The oxygen family non-gaseous element can enter the crystal lattices of the fluorescent material to act on the crystal structure of the fluorescent material so as to change the crystal field environment around the lighting center $Eu^{2+}$ to further influence the position, shape and lighting intensity of the emission peak of the fluorescent material, thus obtaining fluorescent materials having different photochromic properties and widening the application on white light LEDs. At the same time, an elementary substance or a compound of the oxygen family non-gaseous element can play a fluxing action during a synthesis process of the fluorescent material and strengthen the crystallization of the fluorescent material. The fluorescent material with perfect crystallization has excellent lighting properties inevitably.

The introduction of a small amount of oxygen in the fluorescent material can widen the half width of the emission peak of the fluorescent material, which is beneficial for improving the color rendering indexes of lighting devices in practical use. However, excessive oxygen content may result in a sharp decrease in the color purity of the fluorescent material, or even damage the nitride crystal structure to reduce the relative lighting intensity of the fluorescent material. The present disclosure limits the oxygen content and guarantees the application of the series of fluorescent materials on LEDs. At the same time, the existence of trace carbon is beneficial for the stability of the crystal structure of the fluorescent material, thus inhibiting the oxidation of the lighting center $Eu^{2+}$, preventing $Eu^{2+}$ from being converted into $Eu^{3+}$ to damage the lighting efficiency. However, excessive carbon content may pollute the fluorescent material, which not only influences the body color, but also greatly reduces the light efficiency.

In addition, in order to satisfy the application requirements of different lighting devices on the photochromic properties etc. of the fluorescent material, the main emission peak of the fluorescent material of the present disclosure can be regulated through adjusting the variety and proportion of the divalent element represented by M in its general formula. For example, with the increase in the Sr content and the decrease in the Ca content, the main emission peak of the fluorescent material of the present disclosure has a gradual redshift and the luminescent color turns redder. The increase in the Sr content can obviously strengthen the relative fluorescence intensity of the fluorescent material. However, too much Sr may reduce the stability of the fluorescent material.

Raw materials and preparation methods for the synthesis of the fluorescent material involved in the present disclosure are not limited. However, the photochromic properties of the fluorescent material can be improved by the following raw materials and preparation methods. Raw materials for synthesizing the fluorescent material are various metals and nitrides of non-metallic elements preferably. The oxygen content in the nitrides is not higher than 1%. After being weighed according to the required proportions, the raw materials are mixed fully and uniformly. A high-pressure/normal-pressure furnace body with a nitrogen/nitrogen-hydrogen or CO atmosphere is selected as the calcination environment. The oxygen in the atmosphere is prevented from entering the furnace body. The heat preservation time is generally 20 min to 20 h at the highest temperature. When the heat preservation time is too short, the raw materials cannot be fully reacted; while a heat preservation time which is too long will result in overflowing of element N and abnormal growth of fluorescent crystals. Therefore, the heat preservation time is preferably 3 h to 8 h. Subsequently, the temperature in the furnace is reduced to below 100° C., and the powder is taken out and subjected to post-treatment including steps of grinding, acid washing, screening and drying.

The fluorescent film or the fluorescent sheet provided by the present disclosure is prepared by mixing the red fluorescent material of the present disclosure, or the red fluorescent material of the present disclosure and other fluorescent materials uniformly in raw materials of the glass material, the plastic material or the resin material during a preparation process of the glass material, the plastic material or the resin material, and preparing them into a film shape or a sheet shape according to a conventional method of the glass material, the plastic material or the resin material. The adding amount of the red fluorescent material of the present disclosure or a mixture of the red fluorescent material of the present disclosure and other fluorescent materials in the glass material, the plastic material or the resin material is equal to that of a fluorescent material in a fluorescent film or a fluorescent sheet in the prior art. Those skilled in the art may prepare such a fluorescent film or fluorescent sheet provided by the present disclosure through a reasonable technical method based on the present disclosure. Therefore, manufacturing methods of the fluorescent film or the fluorescent sheet will not be repeated here.

Preferably, the other fluorescent materials are one or more of $(Y,Gd,Lu,Tb)_3(Al,Ga)_5O_{12}$:Ce, $(Mg,Ca,Sr,Ba)_2SiO_4$:Eu, $(Ca,Sr)_3SiO_5$:Eu, $(La,Ca)_3Si_6N_{11}$:Ce, α-SiAlON:Eu, β-SiAlON:Eu, $Ba_3Si_6O_{12}N_2$:Eu, $Ca_3(Sc,Mg)_2Si_3O_{12}$:Ce, $CaSc_2O_4$:Eu, $BaAl_8O_{13}$:Eu, $(Ca,Sr,Ba)Al_2O_4$:Eu, $(Sr,Ca,Ba)(Al,Ga,In)_2S_4$:Eu, $(Ca,Sr)_8(Mg,Zn)(SiO_4)_4Cl_2$:Eu/Mn, $(Ca,Sr,Ba)_3MgSi_2O_8$:Eu/Mn, $(Ca,Sr,Ba)_2(Mg,Zn)Si_2O_7$:Eu, $Zn_2SiO_4$:Mn, $(Y,Gd)BO_3$:Tb, ZnS:Cu, Cl/Al, ZnS:Ag, Cl/Al, $(Sr,Ca)_2Si_5N_8$:Eu, $(Li,Na,K)_3ZrF_7$:Mn, $(Li,Na,K)_2(Ti,Zr)F_6$:Mn, $(Ca,Sr,Ba)(Ti,Zr)F_6$:Mn, $Ba_{0.65}Zr_{0.35}F_{2.7}$:Mn, $(Sr,Ca)S$:Eu, $(Y,Gd)Bo_3$:Eu, $(Y,Gd)(V,P)O_4$:Eu $Y_2O_3$:Eu, $(Sr,Ca,Ba,Mg)_5(PO_4)_3Cl$:Eu, $(Ca,Sr,Ba)MgAl_{10}O_{17}$:Eu, $(Ca,Sr,Ba)Si_2O_2N_2$:Eu, $3.5Mg.0.5MgF_2.GeO_2$:Mn. In a process of manufacturing the fluorescent film or the fluorescent sheet, it only needs to mix the red nitride fluorescent material provided by the present disclosure and other fluorescent materials according to any ratio.

Implementation of the technical solution above not only ensures that the fluorescent material involved in the present disclosure is a novel fluorescent material, but also ensures that the novel fluorescent material has excellent performance indexes including lighting efficiency, temperature characteristics, and FWHM etc.

The fluorescent material involved in the present disclosure can be effectively excited by radiation light having a wavelength which is below 500 nm. The fluorescent material or light conversion film materials including resins, silica gel, plastic, glass and ceramic etc. doped with the fluorescent material can be combined with an ultraviolet, purple light or blue light radiation source to form lighting devices. These white light lighting devices can be widely applied in fields including illumination or display.

DETAILED DESCRIPTION OF THE EMBODIMENTS

The followings are the embodiments of the present disclosure. The scope of protection of the present disclosure are not limited in these embodiments, but determined by the claims.

Embodiments 1 to 6

It is predetermined that the molar ratios of the elements in the fluorescent materials of the embodiment 1 to the embodiment 6 are:

Embodiment 1 Ca:Al:Si:Eu:Se:S=0.992:1:1:0.008: 0.00001:0.00003

Embodiment 2 Ca:Al:Si:Eu:Se:Te=0.992:1:1:0.008: 0.0001:0.00002

Embodiment 3 Ca:Al:Si:Eu:Se=0.992:1:1:0.008:0.001

Embodiment 4 Ca:Be:Al:Si:Eu:Se=0.99:0.002:1:1:0.008: 0.005

Embodiment 5 Ca:Mg:Al:Si:Eu:Se=0.991:0.001:1:1: 0.008:0.01

Embodiment 6 Ca:Ba:Zn:Al:Si:Eu:Se=0.981:0.01:0.001: 1:1:0.008:0.02.

Silicon nitride which contains 0.96 wt % of oxygen and has an average particle size of 0.4 μm, aluminum nitride which contains 0.6% of oxygen and has an average particle size of 1.3 μm, europium nitride, calcium nitride, beryllium nitride, magnesium nitride, barium nitride, element selenium, element tellurium and element sulfur are selected as raw materials. The raw materials are weighed according to the proportions above and mixed uniformly. The temperature of the mixed powdery raw materials is preserved at 1500° C. for 5 hours in a nitrogen-hydrogen atmosphere. The temperature is reduced to below 100° C., and then the raw materials are taken out and subjected to post-treatment processes including grinding, washing, drying and screening etc. to obtain a predetermined fluorescent material. The average particle size of the obtained fluorescent material is 10 μm.

Figure 1:
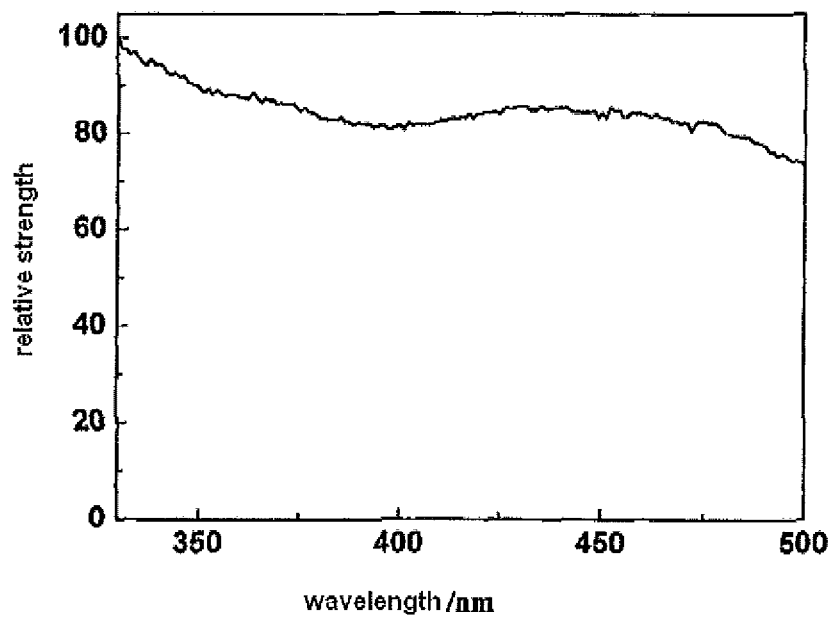
FIG. 1 is an excitation spectrum of a fluorescent material involved in the embodiment 3 of the present disclosure.
Figure 2:
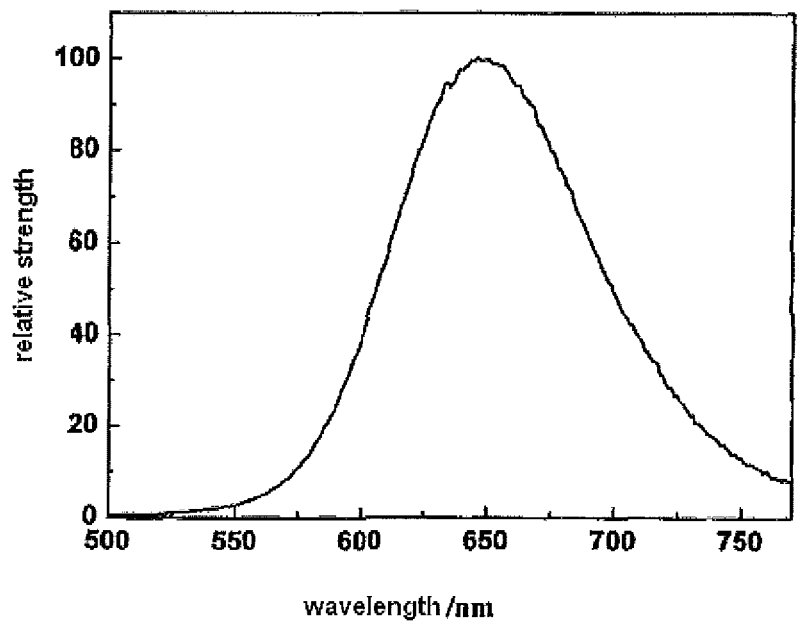
FIG. 2 is an emission spectrum of a fluorescent material involved in the embodiment 3 of the present disclosure.

Table 1 shows an element analytical result (ICPS-7510 weight percentage) of the fluorescent material of the embodiment 3, and the excitation spectrum of the fluorescent material is as shown in FIG. 1. It can be learned from FIG. 1 that the obtained fluorescent material has relatively strong absorption from 325 nm to 500 nm and is applicable to an ultraviolet LED, a near ultraviolet LED, a purple light LED and a blue light LED. FIG. 2 is an emission spectrum of the fluorescent material obtained in the embodiment 3. The emission is a relatively wide emission peak at 600 to 700 nm. The main emission peak is located at 648 nm and presents a pure red light emission.

TABLE 1

Element analytical result of the fluorescent material synthesized in the third embodiment

| Ca (%) | Al (%) | Si (%) | N (%) | Eu (%) | O (%) | Se (%) | other (%) |
|---|---|---|---|---|---|---|---|
| 46.02 | 19.1 | 14.3 | 18.8 | 0.73 | 0.9 | 0.1 | 0.05 |

Table 2 shows comparison data of photochromic properties of the fluorescent materials obtained from the embodiment 1 to the embodiment 6 and those of $Ca_{0.992}AlSiN_3:Eu_{0.008}$ synthesized by the same preparation method. The addition of Se is beneficial for the redshift of the emission peak positions of the fluorescent materials. There is an obvious increase in the relative brightness, which is beneficial for improving the light efficiency of a white light LED.

TABLE 2

Photochromic data of the fluorescent materials synthesized from the embodiment 1 to the embodiment 6 and that of $Ca_{0.9924}SiN_3:Eu_{0.008}$

| | Color coordinate (exited at 460 nm) | | Relative brightness/% | Main peak/ nm | FWMH/ nm |
|---|---|---|---|---|---|
| | x | y | | | |
| $Ca_{0.992}AlSiN_3:Eu_{0.008}$ | 0.6778 | 0.3185 | 100 | 646 nm | 91 |
| Embodiment 1 | 0.6779 | 0.3182 | 112 | 646 nm | 91 |
| Embodiment 2 | 0.6783 | 0.3164 | 117 | 647 nm | 91 |
| Embodiment 3 | 0.6788 | 0.3125 | 128 | 647 nm | 90 |
| Embodiment 4 | 0.6795 | 0.3123 | 120 | 648 nm | 90 |
| Embodiment 5 | 0.6802 | 0.3118 | 114 | 649 nm | 89 |
| Embodiment 6 | 0.6811 | 0.3109 | 107 | 649 nm | 89 |

Embodiments 7 to 12

Silicon nitride, aluminum nitride, europium nitride, calcium nitride, element selenium, gallium nitride, yttrium nitrate, lutetium oxide, lanthanum oxide, gadolinium hydroxide, boric acid, scandium oxide, and indium nitride are selected as raw materials in the present embodiments. The proportions of raw materials of each embodiment are based on the element molar ratios as shown in Table 3. The synthesis and post-treatment techniques of the fluorescent materials are the same as those from the embodiment 1 to the embodiment 6 and photochromic data of the obtained series of fluorescent materials is as shown in Table 3.

TABLE 3

Photochromic data of the series of fluorescent materials obtained from the embodiment 7 to the embodiment 12

| | Element molar ratio | Relative brightness/% | Main peak/ nm |
|---|---|---|---|
| Embodiment 7 | Ca:Al:B:Si:Eu:Se = 0.4999:0.499:0.001:0.5:0.0001:0.0001 | 89 | 628 |
| Embodiment 8 | Ca:Al:Ga:La:Si:Eu:Se = 0.999:0.997:0.002:0.001:1:0.001:0.0001 | 105 | 632 |
| Embodiment 9 | Ca:Al:Si:Eu:Se = 0.992:1:1:0.008:0.0001 | 128 | 641.8 |
| Embodiment 10 | Ca:Al:Gd:Si:Eu:Se = 0.99:0.99:0.01:1:0.01:0.0001 | 108 | 649.8 |
| Embodiment 11 | Ca:Al:Y:Sc:Si:Eu:Se = 0.95:0.997:0.002:0.001:1:0.05:0.0001 | 101 | 666.5 |
| Embodiment 12 | Ca:Al:In:Lu:Si:Eu:Se = 1.35:1.496:0.001:0.003:1.5:0.15:0.0001 | 98 | 675 |

Embodiments 13 to 17

In this group of embodiments, the molar ratios of the elements are: Ca:Al:Si:Eu:Se=0.992:1:1:0.008:0.001. The differences among the embodiments are that the contents of silicon carbide in the raw materials are different, and the mass percentages are 0.001%, 0.01%, 0.1%, 0.2% and 0.4%, respectively. The synthesis and post-treatment techniques of the fluorescent materials are the same as those from the embodiment 1 to the embodiment 6. Table 4 shows a detailed element analytical result (ICPS-7510 weight percentage) of the fluorescent material of the embodiment 15. There is 0.089% of carbon in the fluorescent material, and the relative brightness thereof is increased to different degrees compared with carbon-free fluorescent materials. However, excessive carbon content may result in defects because of too much carbon entering in the crystal lattices. At the same time, there will be impurity phase, thereby reducing the lighting intensity, as shown in Table 5.

TABLE 4

Element analytical result of the fluorescent material synthesized in the embodiment 15

| Ca (%) | Al (%) | Si (%) | N (%) | Eu (%) | O (%) | Se (%) | C (%) | other (%) |
|---|---|---|---|---|---|---|---|---|
| 46.01 | 19.9 | 15.8 | 16.36 | 0.76 | 0.9 | 0.1 | 0.09 | 0.08 |

TABLE 5

Photochromic data of the fluorescent materials synthesized from the embodiment 13 to the embodiment 17

| | Color coordinate (exited at 460 nm) | | Relative bright-ness/% | Main peak position/ nm | FWHM/ nm |
|---|---|---|---|---|---|
| | x | y | | | |
| $Ca_{0.95}AlSiN_3:Eu_{0.05}$ | 0.6902 | 0.3061 | 96 | 667 | 92 |
| Embodiment 13 | 0.6900 | 0.3065 | 101 | 667 | 92 |
| Embodiment 14 | 0.6894 | 0.3070 | 103 | 666 | 91 |
| Embodiment 15 | 0.6886 | 0.3078 | 108 | 665 | 91 |
| Embodiment 16 | 0.6881 | 0.3082 | 101 | 665 | 91 |
| Embodiment 17 | 0.6874 | 0.3095 | 93 | 664 | 90 |

Embodiments 18 to 25

The element molar ratios of the raw materials and the preparation processes of this group of embodiments are the same as those of the embodiment 3. The variety of the divalent element M in the substrate is regulated. Part of Ca in M is substituted by Sr, and the ratio w(Ca/(Sr+Ca)) that the number of atoms of element Ca and element Sr in M satisfies $0.03 \leq w \leq 0.2$. Table 6 shows the photochromic properties of the fluorescent materials prepared from the embodiment 18 to the embodiment 25. The data shows that the shapes and positions of the emission peaks change (blueshift and narrowing) evidently with the increase in the contents of Sr while the relative brightness presents a significant increase.

TABLE 6

Photochromic data of the fluorescent materials synthesized from the embodiment 18 to the embodiment 25

| | | Color coordinate (exited at 460 nm) | | Relative brightness/ % | Main peak/ nm | FWHM/ nm |
|---|---|---|---|---|---|---|
| | w | x | y | | | |
| Embodiment 18 | 0.15 | 0.6389 | 0.3624 | 118 | 618 | 80 |
| Embodiment 19 | 0.2 | 0.6360 | 0.3632 | 138 | 623 | 79 |
| Embodiment 20 | 0.15 | 0.6350 | 0.3645 | 140 | 622 | 79 |
| Embodiment 21 | 0.1 | 0.6335 | 0.3660 | 142 | 621 | 79 |
| Embodiment 22 | 0.08 | 0.6310 | 0.3695 | 146 | 618 | 78 |
| Embodiment 23 | 0.05 | 0.6280 | 0.3715 | 148.6 | 616 | 77 |
| Embodiment 24 | 0.03 | 0.6223 | 0.3745 | 158 | 612 | 76 |
| Embodiment 25 | 0.02 | 0.6215 | 0.3756 | 126 | 610 | 74 |

Embodiments 26 to 32

Selection of the raw materials of this group of embodiments is substantially the same as that of the embodiment 3 and part of silicon dioxide ($Si_v$) is selected as the silicon source to replace silicon nitride ($Si_u$). The proportions of the raw materials of the embodiments are based on the element molar ratios as shown in Table 7. The synthesis and post-treatment techniques of the fluorescent materials are the same as those of the embodiment 3 and photochromic data of the obtained series of fluorescent materials is as shown in Table 7.

TABLE 7

Photochromic data of the series of fluorescent materials obtained from the embodiment 26 to the embodiment 32

| | Element molar ratio | Oxygen concentration/ wt % | Relative brightness/% | Main peak/ nm |
|---|---|---|---|---|
| Embodiment 26 | $Ca:Al:Si_u:Si_v:Eu:Se =$ 0.992:1:0.999:0.001:0.008:0.001 | 0.93 | 117 | 641 |
| Embodiment 27 | $Ca:Al:Si_u:Si_v:Eu:Se =$ 0.992:1:0.995:0.005:0.008:0.001 | 1.0 | 120 | 639 |
| Embodiment 28 | $Ca:Al:Si_u:Si_v:Eu:Se =$ 0.992:1:0.95:0.05:0.008:0.001 | 2.01 | 124 | 635 |
| Embodiment 29 | $Ca:Al:Si_u:Si_v:Eu:Se =$ 0.992:1:0.9:0.1:0.008:0.001 | 2.3 | 131 | 630 |
| Embodiment 30 | $Ca:Al:Si_u:Si_v:Eu:Se =$ 0.992:1:0.87:0.13:0.008:0.001 | 3.4 | 134 | 626 |
| Embodiment 31 | $Ca:Al:Si_u:Si_v:Eu:Se =$ 0.992:1:0.85:0.15:0.008:0.001 | 4.4 | 135 | 624 |
| Embodiment 32 | $Ca:Al:Si_u:Si_v:Eu:Se =$ 0.992:1:0.83:0.17:0.008:0.001 | 4.9 | 140 | 618 |

Embodiments 33 to 38

Selection of the raw materials of this group of embodiments is substantially the same as that of the embodiment 1 to the embodiment 6. The proportions of the raw materials in the embodiments are based on the element molar ratios as shown in Table 8. The synthesis and post-treatment techniques of the fluorescent materials are the same as those of the embodiment 1 to the embodiment 6 and photochromic data of the obtained series of fluorescent materials is as shown in Table 8.

TABLE 8

Photochromic data of the series of fluorescent materials obtained from the embodiment 33 to the embodiment 38

| | Element molar ratio | Relative brightness/ % | Main peak/ nm |
|---|---|---|---|
| Embodiment 33 | Ca:Al:Si:Ge:Eu:Se = 0.992:1:0.995:0.005:0.008:0.0001 | 116 | 641.8 |
| Embodiment 34 | Ca:Al:Si:Sn:Ti:Eu:Se = 0.992:1:0.994:0.005:0.001:0.008:0.0001 | 116 | 642 |
| Embodiment 35 | Ca:Al:La:Si:Zr:Hf:Eu:Se = 0.992:0.999:0.001:0.994:0.003:0.003:0.008:0.0001 | 115 | 642.5 |
| Embodiment 36 | Ca:Al:Si:Eu:Se:F = 0.992:1:1:0.008:0.0001:0.001 | 116 | 643 |
| Embodiment 37 | Ca:Al:La:Si:Eu:Ce:Se = 0.991:0.995:0.005:1:0.008:0.001:0.0001 | 125 | 638 |
| Embodiment 38 | Ca:Al:La:Si:Eu:Mn:Se = 0.9915:0.995:0.005:1:0.008:0.0005:0.0001 | 131 | 641 |

Embodiment 39

The present embodiment applies a blue light LED chip as a radiation source. Three fluorescent materials, a red fluorescent material, a white light LED yellow fluorescent material (e.g. $Y_3Al_5O_{12}$:Ce), and a green fluorescent material (e.g. $Ba_3Si_6O_{12}N_2$:Eu) in the embodiment 3 of the present disclosure in a weight ratio of red:yellow:green=17:52:31 are uniformly dispersed in silica gel (refractive index 1.41, transmittance 99%). The chip and a light conversion film are combined, circuits are welded and a white light illuminating device is obtained after sealing. The color coordinate of the white light illuminating device is (0.3728, 0.3336), the color rendering index is 93 and the correlated color temperature is 3859K.

Embodiment 40

The present embodiment applies a near purple light LED chip (380 nm) as a radiation source. Three fluorescent materials, a red fluorescent material, a blue light fluorescent material (e.g. $BaMgAl_{10}O_{17}$:Eu), and a green fluorescent material (e.g. $(Y,Lu)_3(Al,Ga)_5O_{12}$:Ce) in the twenty-third embodiment of the present disclosure in a weight ratio of red:blue:green=16:55:29 are uniformly dispersed in a epoxy resin (refractive index 1.6). The chip and the epoxy resin are combined, circuits are welded and a white light illuminating device is obtained after sealing. The color coordinate of the white light illuminating device is (0.3879, 0.3404), the color rendering index is 92.4 and the correlated color temperature is 3469K.

Embodiment 41

The present embodiment applies an ultraviolet LED chip (360 nm) as a radiation source. Three fluorescent materials, a red fluorescent material, a blue fluorescent material (e.g. $Sr_5(PO_4)_3Cl$:Eu), and a green fluorescent material (e.g. β-SiAlON:Eu) in the embodiment 32 of the present disclosure in a weight ratio of red:blue:green-13:60:27 are uniformly dispersed in silica gel (refractive index 1.41, transmittance 99%). The chip and silica gel are combined, circuits are welded and a white light illuminating device is obtained after sealing. The color coordinate of the white light illuminating device is (0.3882, 0.3401), the color rendering index is 92.3 and the correlated color temperature is 3460K.

Embodiment 42

The present embodiment applies a purple light LED chip (410 nm) as a radiation source. Three fluorescent materials, a red fluorescent material, a blue fluorescent material (e.g. $BaMgAl_{10}O_{17}$:Eu), and a green fluorescent material (e.g. $Ca_3Sc_2Si_3O_{12}$:Ce) in the embodiment 38 of the present disclosure in a weight ratio of red:blue:green=10:60:30 are uniformly dispersed in a epoxy resin (refractive index 1.6). The chip and the epoxy resin are combined, circuits are welded and a white light illuminating device is obtained after sealing. The color coordinate of the white light illuminating device is (0.3517, 0.4046), the color rendering index is 91.1 and the correlated color temperature is 4647K.

What is claimed is:

1. A Light Emitting Diode (LED) red fluorescent material, comprising:
   an element M, wherein the element M contains at least one element of Be, Mg, Ca, Sr, Ba, and Zn;
   an element A, wherein the element A contains at least one element of B, Al, Ga, In, La, Gd, Lu, Sc and Y;
   an element D, wherein the element D contains at least one element of Si, Ge, C, Sn, Ti, Zr and Hf;
   an element X, wherein the element X contains at least one element of N, O, and F;
   an element L, wherein the element L contains at least one element of S, Se, and Te;
   an element Z, wherein the element Z contains at least one of a rare-earth element and a transition-metal element; and
   a formula of $M_mA_aD_bX_dL_y:Z_n$, wherein $0.5 \le m \le 1.5$, $0.5 \le a \le 1.5$, $0.5 \le b \le 1.5$, $2 \le d \le 5$, $0.00001 \le y \le 0.02$ and $0.0001 \le n \le 0.1$.

2. The LED red fluorescent material according to claim 1, wherein the element M contains at least one element of Ca, Sr and Ba; the element A contains at least one element of Al, B, Gd and Y; the element D contains at least one element of Si and C; the element X contains at least one element of N and O; the element L contains the element Se; the element Z contains at least one element of Eu, Ce and Mn.

3. The LED red fluorescent material according to claim 1, wherein the element M contains the element Sr.

4. The LED red fluorescent material according to claim 3, wherein the element M is the element Ca and the element Sr.

5. The LED red fluorescent material according to claim 4, wherein an atom number ratio Ca/(Sr+Ca) is w, wherein $0.03 \le w \le 0.2$.

6. The LED red fluorescent material according to claim 1, wherein the element D contains the element C.

7. The LED red fluorescent material according to claim 6, wherein a weight percentage of the element C of the LED red fluorescent material is in the range of 0.001% to 0.4%.

8. The LED red fluorescent material according to claim 1, wherein the element X contains the element O.

9. The LED red fluorescent material according to claim 8, wherein a weight percentage of the element O of the LED red fluorescent material is in the range of 0.01% to 5%.

10. The LED red fluorescent material according to claim 1, wherein the element D contains the element C; the element X contains the element O; the weight percentage of the element C in the red fluorescent material is in the range of 0.001% to 0.4% and the weight percentage of the element O in the red fluorescent material is in the range from 0.01% to 5%.

11. The LED red fluorescent material according to claim 1, wherein the LED red fluorescent material is one of a powder shape, a film shape and a sheet shape.

12. A method of forming one of a fluorescent film and a fluorescent sheet, comprising the steps of:
   providing an LED red fluorescent material comprising:
      an element M, wherein the element M contains at least one element of Be, Mg, Ca, Sr, Ba, and Zn;
      an element A, wherein the element A contains at least one element of B, Al, Ga, In, La, Gd, Lu, Sc and Y;
      an element D, wherein the element D contains at least one element of Si, Ge, C, Sn, Ti, Zr and Hf;
      an element X, wherein the element X contains at least one element of N, O, and F;
      an element L, wherein the element L contains at least one element of S, Se, and Te;
      an element Z, wherein the element Z contains at least one of a rare-earth element and a transition-metal element; and
      a formula of $M_mA_aD_bX_dL_y:Z_n$, wherein $0.5 \le m \le 1.5$, $0.5 \le a \le 1.5$, $0.5 \le b \le 1.5$, $2 \le d \le 5$, $0.00001 \le y \le 0.02$ and $0.0001 \le n \le 0.1$; and
   at least one of dispersing the LED red fluorescent material in one of a glass material, a plastic material, and a resin material, dispersing the LED red fluorescent material and an other fluorescent material in at least one of the glass material, the plastic material, and the resin material, and coating the LED red fluorescent material and the other fluorescent material on at least one of the glass material, the plastic material, and the resin material.

13. The method according to claim 12, wherein the other fluorescent material is at least one material of (Y,Gd,Lu,Tb)$_3$(Al,Ga)$_5$O$_{12}$:Ce, (Mg,Ca,Sr,Ba)$_2$SiO$_4$:Eu, (Ca,Sr)$_3$SiO$_5$:Eu, (La,Ca)$_3$Si$_6$N$_{11}$:Ce, α-SiAlON:Eu, β-SiAlON:Eu, Ba$_3$Si$_6$O$_{12}$N$_2$:Eu, Ca$_3$(Sc,Mg)$_2$Si$_3$O$_{12}$:Ce, CaSc$_2$O$_4$:Eu, BaAl$_8$O$_{13}$:Eu, (Ca,Sr,Ba)Al$_2$O$_4$:Eu, (Sr,Ca,Ba)(Al,Ga,In)$_2$S$_4$:Eu, (Ca,Sr)$_8$(Mg,Zn)(SiO$_4$)$_4$Cl$_2$:Eu/Mn, (Ca,Sr,Ba)$_3$MgSi$_2$O$_8$:Eu/Mn, (Ca,Sr,Ba)$_2$(Mg,Zn)Si$_2$O$_7$:Eu, Zn$_2$SiO$_4$:Mn, (Y,Gd)BO$_3$:Tb, ZnS:Cu, Cl/Al, ZnS:Ag, Cl/Al, (Sr,Ca)$_2$Si$_5$N$_8$:Eu, (Li,Na,K)$_3$ZrF$_7$:Mn, (Li,Na,K)$_2$(Ti,Zr)F$_6$:Mn, (Ca,Sr,Ba)(Ti,Zr)F$_6$:Mn, Ba$_{0.65}$Zr$_{0.35}$F$_{2.7}$:Mn, (Sr,Ca)S:Eu, (Y,Gd)BO$_3$:Eu, (Y,Gd)(V,P)O$_4$:Eu, Y$_2$O$_3$:Eu, (Sr,Ca,Ba,Mg)$_5$(PO$_4$)$_3$Cl:Eu, (Ca,Sr,Ba)MgAl$_{10}$O$_{17}$:Eu, (Ca,Sr,Ba)Si$_2$O$_2$N$_2$:Eu, and 3.5MgO.0.5MgF$_2$.GeO$_2$:Mn.

14. A lighting device comprising:
an LED red fluorescent material comprising:
an element M, wherein the element M contains at least one element of Be, Mg, Ca, Sr, Ba, and Zn;
an element A, wherein the element A contains at least one element of B, Al, Ga, In, La, Gd, Lu, Sc and Y;
an element D, wherein the element D contains at least one element of Si, Ge, C, Sn, Ti, Zr and Hf;
an element X, wherein the element X contains at least one element of N, O, and F;
an element L, wherein the element L contains at least one element of S, Se, and Te; and
an element Z, wherein the element Z contains at least one of a rare-earth element and a transition-metal element;
a formula of $M_mA_aD_bX_dL_y:Z_n$, wherein 0.5≤m≤1.5, 0.5≤a≤1.5, 0.5≤b≤1.5, 2≤d≤5, 0.00001≤y≤0.02 and 0.0001≤n≤0.1; and
a radiation source cooperating with the LED red fluorescent material to emit a light.

15. The lighting device according to claim 14, wherein the radiation source is one of a vacuum ultraviolet radiation source, an ultraviolet radiation source, a purple light radiation source, and a blue light emission source.

16. The lighting device according to claim 14, wherein the lighting device further comprises at least one other fluorescent material cooperating with the radiation source to emit light.

17. The lighting device according to claim 16, wherein the at least one other fluorescent material is at least one of (Y,Gd,Lu,Tb)$_3$(Al,Ga)$_5$O$_{12}$:Ce, (Mg,Ca,Sr,Ba)$_2$SiO$_4$:Eu, (Ca,Sr)$_3$SiO$_5$:Eu, (La,Ca)$_3$Si$_6$N$_{11}$:Ce, α-SiAlON:Eu, β-SiAlON:Eu, Ba$_3$Si$_6$O$_{12}$N$_2$:Eu, Ca$_3$(Sc,Mg)$_2$Si$_3$O$_{12}$:Ce, CaSc$_2$O$_4$:Eu, BaAl$_8$O$_{13}$:Eu, (Ca,Sr,Ba)Al$_2$O$_4$:Eu, (Sr,Ca,Ba)(Al,Ga,In)$_2$S$_4$:Eu, (Ca,Sr)$_8$(Mg,Zn)(SiO$_4$)$_4$Cl$_2$:Eu/Mn, (Ca,Sr,Ba)$_3$MgSi$_2$O$_8$:Eu/Mn, (Ca,Sr,Ba)$_2$(Mg,Zn)Si$_2$O$_7$:Eu, Zn$_2$SiO$_4$:Mn, (Y,Gd)BO$_3$:Tb, ZnS:Cu, Cl/Al, ZnS:Ag, Cl/Al, (Sr,Ca)$_2$Si$_5$N$_8$:Eu, (Li,Na,K)$_3$ZrF$_7$:Mn, (Li,Na,K)$_2$(Ti,Zr)F$_6$:Mn, (Ca,Sr,Ba)(Ti,Zr)F$_6$:Mn, Ba$_{0.65}$Zr$_{0.35}$F$_{2.7}$:Mn, (Sr,Ca)S:Eu, (Y,Gd)BO$_3$:Eu, (Y,Gd)(V,P)O$_4$:Eu, Y$_2$O$_3$:Eu, (Sr,Ca,Ba,Mg)$_5$(PO$_4$)$_3$Cl:Eu, (Ca,Sr,Ba)MgAl$_{10}$O$_{17}$:Eu, (Ca,Sr,Ba)Si$_2$O$_2$N$_2$:Eu, and 3.5MgO.0.5MgF$_2$.GeO$_2$:Mn.

\* \* \* \* \*